United States Patent
Koslov et al.

(10) Patent No.: US 6,668,029 B1
(45) Date of Patent: Dec. 23, 2003

(54) METHODS AND APPARATUS FOR IMPLEMENTING DIGITAL RESAMPLING CIRCUITS

(75) Inventors: Joshua L. Koslov, Hopewell, NJ (US); Frank Anton Lane, Medford Lakes, NJ (US)

(73) Assignee: Hitachi America, Ltd., Tarrytown, NY (US)

( * ) Notice: Subject to any disclaimer, the term of this patent is extended or adjusted under 35 U.S.C. 154(b) by 0 days.

(21) Appl. No.: 09/419,265

(22) Filed: Oct. 15, 1999

Related U.S. Application Data
(60) Provisional application No. 60/112,029, filed on Dec. 11, 1998.

(51) Int. Cl.$^7$ ............................................... H04B 1/10
(52) U.S. Cl. .................... 375/350; 375/355; 704/265; 708/313
(58) Field of Search ............................. 375/355, 350; 704/265; 708/313

(56) References Cited

U.S. PATENT DOCUMENTS

| | | | | |
|---|---|---|---|---|
| 4,989,221 A | * | 1/1991 | Qureshi et al. ............. 375/222 |
| 5,732,002 A | * | 3/1998 | Lee et al. ................... 708/313 |
| 6,226,758 B1 | * | 5/2001 | Gaalaas et al. ............. 713/600 |

OTHER PUBLICATIONS

Laakso et al. ("Splitting the delay—tools for fractional delay design." IEEE Signal Processing Mag., vol. 13, No. 1, pp. 30–60. Jan. 1996.).*

* cited by examiner

Primary Examiner—Stephen Chin
Assistant Examiner—Guillermo Munoz
(74) Attorney, Agent, or Firm—Straub & Pokotylo; Michael P. Straub (57) ABSTRACT

Methods and apparatus for implementing digital resampling circuits which create one or more bitstreams which include samples at desired rates, from an input bitstream having a fixed sample rate, are described. The resampling circuits of the present invention achieve the desired sample rates by performing digital interpolation on samples included in the input signal. The interpolation is performed using a filter, e.g., an all-pass infinite impulse response filter which produces an output as a function of a controllable signal delay.

9 Claims, 5 Drawing Sheets

METHODS AND APPARATUS FOR IMPLEMENTING DIGITAL RESAMPLING CIRCUITS

RELATED APPLICATIONS

This application claims the benefit U.S. Provisional Application No. 60/112,029, filed Dec. 11, 1998.

FIELD OF THE INVENTION

The present invention is directed to resampling circuits and, more particularly, to digital resampling circuits capable of performing interpolation.

BACKGROUND OF THE INVENTION

In various signal processing applications, e.g. demodulation, it is desirable to obtain samples at a particular frequency, e.g., sample rate, for ease of processing.

Assuming an analog input, one way of generating the samples at the desired sample rate is to sample the analog input at the desired rate, e.g., using an analog to digital (A/D) converter. This normally involves using a crystal oscillator to control the sampling rate of the A/D converter.

Frequently, the sampling of an input signal needs to be synchronized with symbols in a received signal, e.g., a QAM signal and needs to be a multiple of the symbol rate. In the case where multiple symbol rates are to be supported, this frequently involves supporting multiple sampling rates, e.g., using different oscillators.

The processing of quadrature amplitude modulated (QAM) signals is exemplary of a case where signal sampling rate and synchronization issues arise. In the case of quadrature amplitude modulation (QAM), it is often desirable to have input samples to a demodulator at four times the symbol rate, with the sampling being synchronized with the symbols in the signal. One known way of doing this is to have a timing recovery loop that feeds back a correction signal to an external voltage-controlled crystal oscillator (VCXO) which, in turn, controls the sampling rate of an analog-to-digital (A/D) converter. This has the disadvantage of requiring analog circuitry associated with the VCXO and the timing recovery loop used to control the VCXO. In the case of demodulators that support decoding multiple symbol rates of QAM, in order for the demodulator to sample the signal at four times the symbol rate in the known manner, multiple VCXOs or a VCXO with multiple, switched crystals are required.

Generally, digital circuit implementations tend to be more reliable than analog circuit implementations. In addition, given the relatively low cost of adding digital components to integrated circuits, there continues to be a preference towards replacing analog circuit implementations with digital circuits—particularly in cases where digital circuits are being used to perform at least some functions.

In view of the above, it becomes apparent that it would be desirable to be able to sample an analog signal at one fixed rate, e.g., frequency, and then use digital signal processing to convert the resulting bitstream to a bitstream having the desired sample characteristics, e.g., a desired sample rate. It is desirable that the digital signal resampling circuits be suitable for use in a wide variety of applications including, but not limited to, demodulator circuits. It is also desirable that the circuits perform interpolation and not merely drop or repeat some of the input signals to achieved the desired output sample rate.

Accordingly, there is a need for methods and apparatus for converting a bitstream having a first sample rate into a bitstream having a second, e.g., desired sample rate. It is desirable that resampling circuits used to perform such a function be capable of being implemented as digital circuits. It is also desirable that any new resampling circuits avoid the need for multiple VCXOs and/or analog filter loops. It is also desirable that any new resampling circuits be capable of performing interpolation.

SUMMARY OF THE INVENTION

The present invention is directed to methods and apparatus for performing resampling operations. In particular, the present invention is directed to methods and apparatus for implementing digital resampling circuits which create one or more bitstreams which include samples at desired rates, from an input bitstream. The resampling circuits of the present invention achieve the desired sample rates by performing digital interpolation on samples included in an input bitstream. The interpolation is performed using a filter, e.g., an all-pass infinite impulse response filter which produces an output as a function of a controllable signal delay. As is known in the art, all-pass filters pass all frequencies input thereto.

Accordingly, through the use of digital signal processing, an input bitstream having a first sample rate can be processed to produce a bitstream having a desired second sample rate which is different from the first sample rate. This allows one or more bitstreams having different desired sample rates to be generated from an input bitstream without the use of VCXOs or analog control loops.

Thus, the digital resampling circuit of the present invention can be used to modify the sample rate of a signal. This allows demodulators and other devices requiring a desired sampling rate to generate an input bitstream using an A/D converter running off a fixed crystal oscillator, with required adjustments in the sampling rate being made by the resampling circuit of the present invention. Thus, the present invention eliminates the need for a VCXO or multiple VCXOs in a system which requires the ability to generate a signal having a desired sampling rate from an input signal.

In order to effectively resample a signal, the resampling circuit of the present invention utilizes an all-pass infinite impulse response (IIR) filter with an adjustable coefficient to effect variable delays. The variable delay IIR filter may be implemented in two stages, e.g., the first stage comprising multiple fixed delay IIR filters, and a second stage comprising an IIR filter with a finely adjustable variable delay structure. By selectively combining one of the fixed delay filters and by adjusting the second stage IIR filter delay, large adjustments in the time periods between samples can be achieved without having to implement a single variable delay structure equal to the full range of possible delays.

The digital resampling circuit of the present invention can be used in a wide range of application where a digital signal having a first sample rate needs to be processed to produce one or more digital signals having different sampling rates.

Various additional features and advantages of the present invention will be apparent from the detailed description which follows.

DETAILED DESCRIPTION

As discussed above, the present invention is directed to methods and apparatus for implementing digital resampling circuits. In particular, the present invention is directed to circuits which are capable of receiving a signal having a first sample rate and processing it to generate a signal having a second sample rate which can be less than the first sample rate. In accordance with the present invention, interpolation is performed as required through the use of one or more filters.

Figure 1:
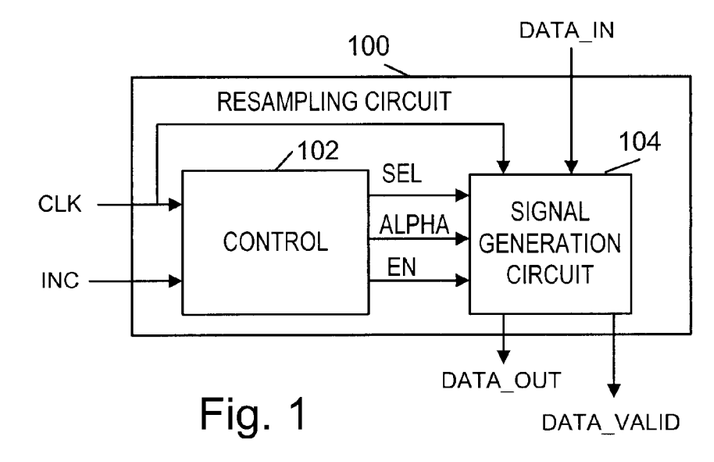
FIG. 1 illustrates a digital resampling circuit implemented in accordance with the present invention.

FIG. 1 illustrates an exemplary resampling circuit 100 implemented in accordance with the present invention. The resampling circuit 100 receives as its inputs a master clock signal CLK, an increment signal INC, and a data input signal DATA_IN. The DATA_IN signal includes a plurality of samples and has a first, e.g., input, sample rate. The resampling circuit 100 converts the input samples in the signal DATA_IN to the same or a lower sample rate, e.g., an output sample rate. Output samples are registered by the master clock signal CLK. A data valid signal, DATA_VALID, is used to indicate when the resampling circuit output is valid.

In the FIG. 1 embodiment, the master clock CLK is supplied to both the control circuit and the signal generation circuit. The clock signal CLK is a signal which corresponds to the sample rate of the data input signal DATA_IN. The master clock signal CLK may be, e.g., the same clock signal which drives an A/D converter to generate the DATA_IN signal from an analog signal. The increment signal INC is proportional to the desired change in the sample rate, i.e., it corresponds to the input sample rate (ISR) divided by the desired sample rate (DSR). That is, INC=ISR/DSR. Because, in the exemplary embodiment, the ISR is greater than or equal the DSR, the signal INC will assume values greater than or equal to one. The control signal INC can, and in at least one embodiment is, varied over time to produce different output sample rates. Thus, an input signal can be sampled at a single fixed rate and the INC signal adjusted to produce a desired output sample rate which is lower than the input sample rate. The INC signal may be controlled, in the case of a demodulator embodiment, as part of a carrier recovery loop thereby avoiding the need to use a VCXO to support sampling rate adjustments or multiple VCXO's to support different sampling rates.

The resampling circuit 100 generates as its output a data output signal, DATA_OUT, and a valid data indicator signal DATA_VALID. The valid data indicator signal DATA_VALID indicates when an output sample value included in the data output signal DATA_OUT should or should not be used. When the DATA_VALID signal is asserted, e.g., set to "1", the sample output on the DATA_OUT line is intended to be used as a sample in the new bitstream having the adjusted sample rate. When the DATA_VALID signal is de-asserted, e.g., set to "0", the sample output on the DATA_OUT line is intended to be ignored and not used in the new bitstream having the adjusted sample rate.

The resampling circuit 100 comprises a control circuit 102 and a signal generation circuit 104. The control circuit 102 receives as its input the master clock signal CLK and the increment signal INC.

The control circuit 102 produces an enable signal EN by determining, as a function of the input increment signal INC and the master clock signal CLK, by when an output sample should be produced. The EN signal indicates to the signal generation circuit 104 that an output sample is to be produced. The increment signal INC is analogous to the voltage control input to a VCXO. In this invention, a higher increment indicates a longer period between output samples, hence a lower output sampling rate. Since the master clock signal CLK and output valid indicator DATA_VALID are used in this embodiment (indicating that some samples output at the rate CLK may not be used), the output samples will occur at a rate equal to or lower than the input rate. Accordingly, for the circuit 100 to function properly, the control signal INC should be greater than or equal to unity.

Based upon the desired time to be interpolated, which is a function of the INC signal, the control circuit 102 generates control information about the delay to be utilized in the signal generation circuit 104. Control signals, e.g., a select signal SEL, an ALPHA signal and an enable signal EN, are generated by the control circuit 102 as a function of delay and timing information produced by the control circuit 102. The control signals SEL and ALPHA are used, as will be discussed below, to control operation of fixed and variable delay portions of the signal generation circuit 104. The enable signal EN is used to indicate when the signal generation circuit 104 should produce an output.

The signal generation circuit 104 uses the information from the control block when processing the input data samples received in the signal DATA_IN. When the enable signal EN indicates that an output is to be produced, an output sample is produced by the circuit 104 based on a delayed version of the input signal DATA_IN. The delay of the input signal DATA_IN is made up of a selectable fixed delay, selected by the SEL signal, and a variable delay, whose delay is controlled by the ALPHA signal.

The resampling circuit 100 is based on using all-pass IIR filters in the signal generation circuit 104 to generate output samples and to perform interpolation as required. In the exemplary embodiment, the utilized all pass filters have the following transfer function:

$$H(z)=(\alpha+z^{-1})/(1+\alpha z^{-1})$$

In accordance with the present invention, filtering using one or more filters with the above transfer function is used to effect variable delays, in order to accomplish resampling by estimating, e.g., interpolating, signal values at desired times between input samples. By varying coefficient α, the delay of the filter can be varied.

Figure 2:
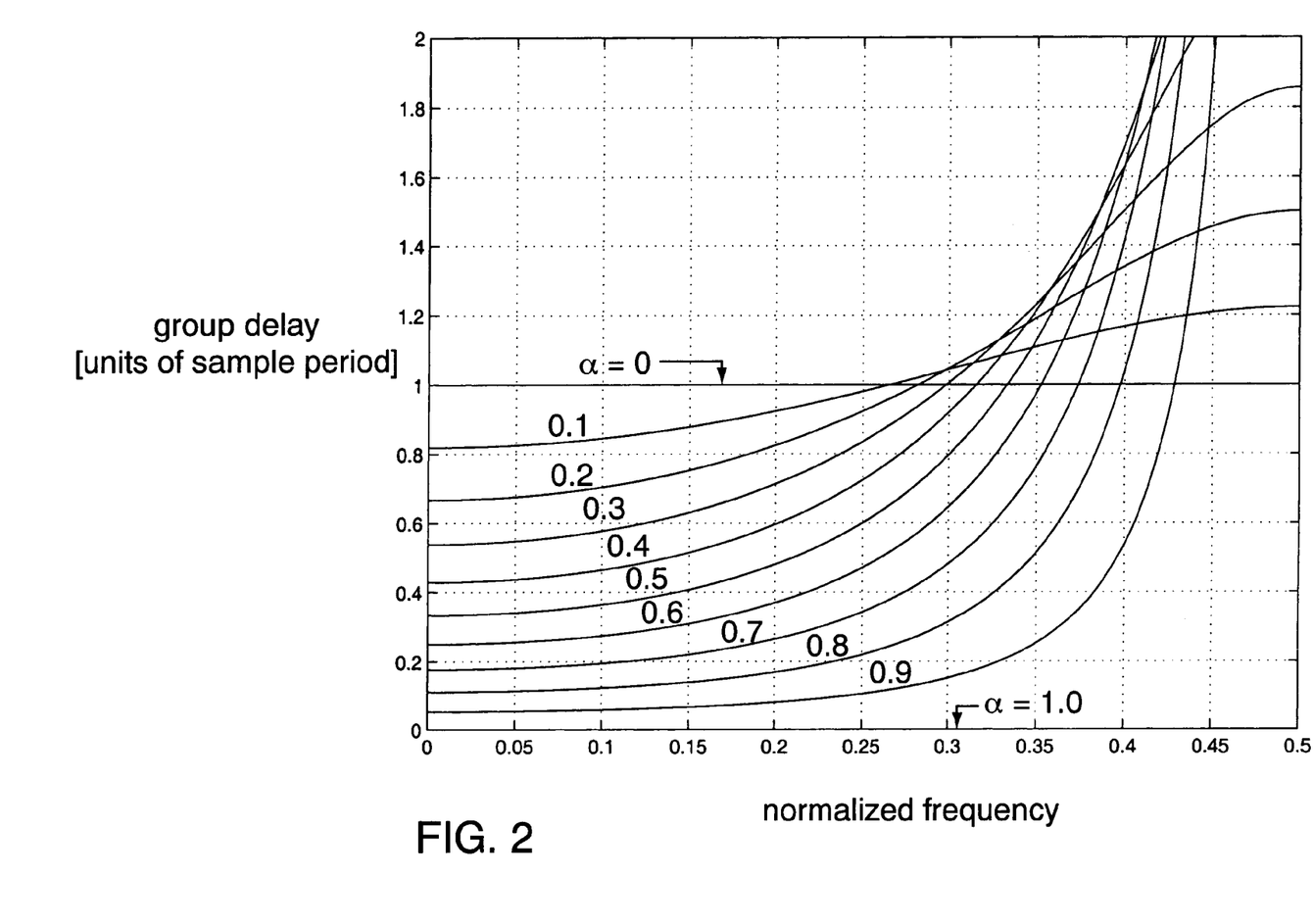
FIG. 2 shows the relationship of a filter coefficient α to the group delay created by an all-pass filter using the filter coefficient α in accordance with the present invention.

FIG. 2 shows the relationship of the coefficient α in a filter having the above transfer function to the group, i.e., signal, delay, as a function of normalized frequency. The delay associated with a number of different alpha values ranging from 0 to 1 is illustrated. Notice that, for a given alpha, the delay is not constant across all frequencies. Particularly, at higher frequencies, the delay varies markedly. For this reason, less distortion is imposed by the all-pass filter circuit when the signal-of-interest frequencies are well below the Nyquist rate.

Figure 3:
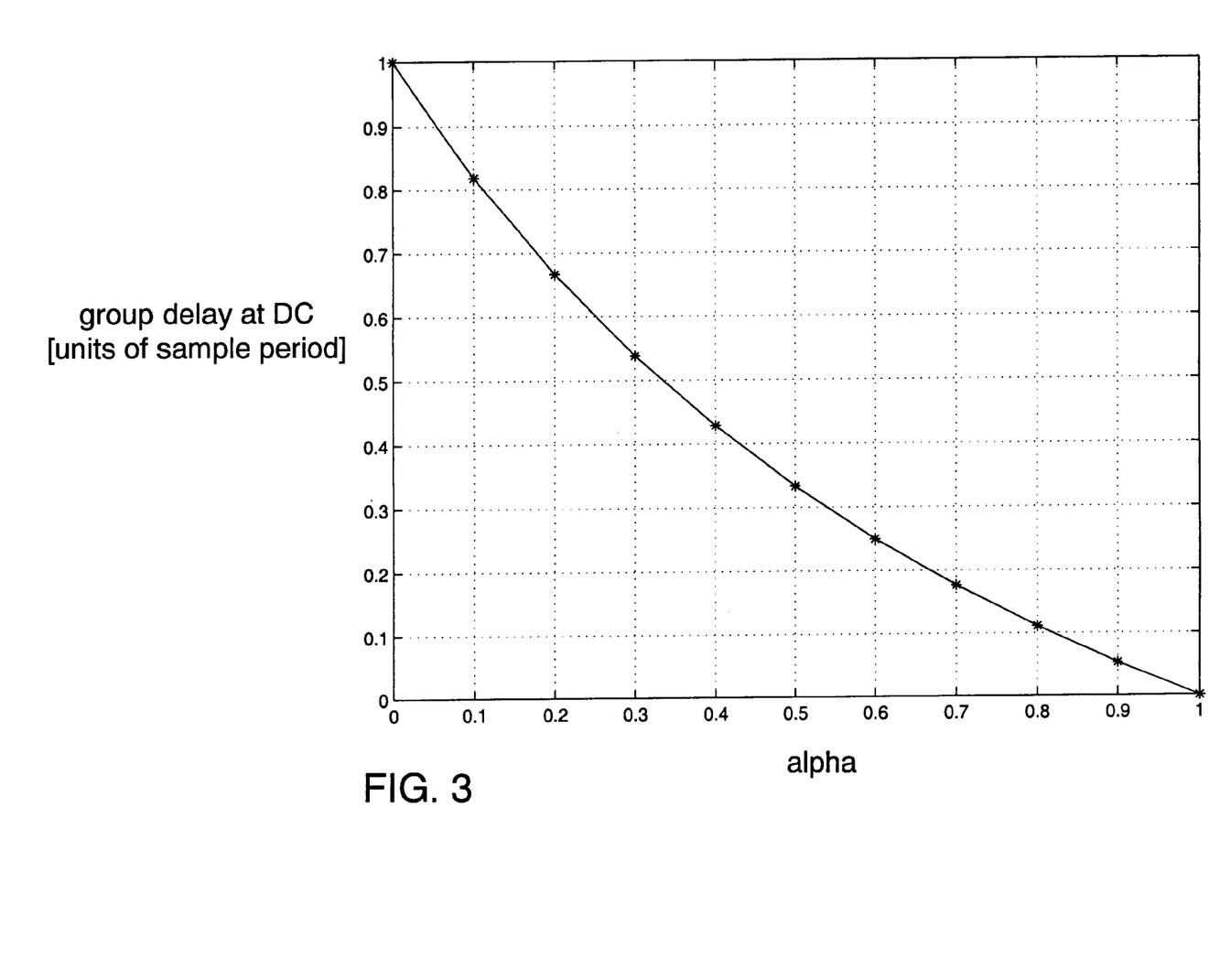
FIG. 3 shows the relationship, at low signal frequencies, between the filter coefficient α and the group delay created by an allpass filter using the filter coefficient α in accordance with the present invention.

FIG. 3 shows the relationship of α to the group, i.e., signal, delay at low frequencies, i.e., 0 Hz. Note that the relationship between α and the signal delay is non-linear. However, for small ranges of delays, the relationship between α and the resulting delay can be approximated as being linear. However, rather than make such an approximation, a lookup table can be used to convert between a desired delay period and the alpha required to produce the desired delay.

Consider resampling to a lower rate by a ratio of input to output samples, INC, that corresponds to 1.25. In such a case, the ratio of output samples to input samples is 1/1.25= 0.8. In terms of original input samples, we want output samples corresponding to times at increments of the input signal period times 1.25, i.e., an output is desired at times 1, 2.25, 3.5, 4.75, 6, . . . , etc. In such an embodiment the delay of the signal block included in the signal generation circuit 104 is varied so that, if T represents the input sample times, at time T=1 we would use a zero delay, at time T=2 we would not take a sample, at T=3 time we would use a 0.75 delay (gives value at time 2.25), at T=4 we would use a 0.5 delay (gives value at time 3.5), at T=5 we would use a 0.25 delay (gives value at time 4.75), at T=6 a zero delay, etc.

As the delay decreases from output sample to output sample, coefficient α increases so that, at some point, it wraps around from one to zero. This wrapping around and varying of α can have a deleterious effect on the ultimate SNR as a function of the resampling rate. As resampling rates diverge further and further from unity, SNR goes down.

The inventors of the present invention realized that resampling circuit performance could be improved by effectively upsampling the input signal before adding a variable delay, so that the range over which the variable delay operates can be reduced. In accordance with the present invention, the input signal can be upsampled using either (finite impulse response) FIR or IIR structures. Simple IIR structures similar to the variable-delay filter, but having fixed coefficients α can, and in the exemplary embodiment are, used.

In the exemplary embodiment illustrated in the figures shown, it has been found effective to break each input sample into four effective upsamples, using four fixed-delay filters, one of which is just a zero-delay filter.

By using three fixed filters with delays of 0.25, 0.5 and 0.75 of the input sampling period, at each time of the input clock kT, the values of the signal at kT, (k−0.25)T, (k−0.5)T and (k−0.75)T are available. In order to implement the full range of needed delay 0 to 1T, the appropriate fixed delay is selected, followed by a variable delay of 0 to 0.25T. However, the variable delay of 0 to 0.25 results in coefficients α of 1 to 0.6, with wraparound effects. The system has better SNR when the variable delay is selected from 0.75T to 1T, with α of 0.1428 to 0, giving a smaller "wrap" amplitude jump. Since the absolute delay (latency) of the signal circuit is not critical, it is only important that the variable delay have a range of 0.25 of a symbol time in the exemplary embodiment.

Figure 4:
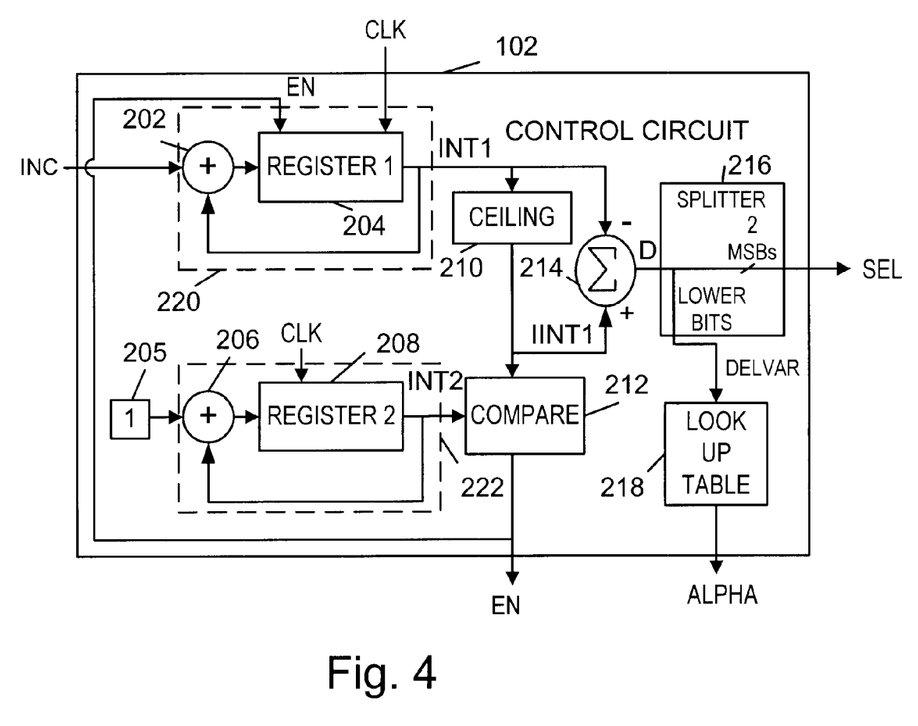
FIG. 4 illustrates a control circuit suitable for use in the digital resampling circuit illustrated in FIG. 1.

FIG. 4 shows the detailed structure of the exemplary control circuit 102. As illustrated, the control circuit 102 comprises first and second summers 202, 206, first and second registers 204, 208, a ceiling circuit 210, a comparator 212, a third summer 214, a splitter 216 and a look-up table 218 which are coupled together as illustrated in FIG. 4.

The first summer 202 and first register 204, are combined with a feedback loop to form a first accumulator 220. The first register 204 is used for storing and outputting the value generated by the first summer 202. Since the register 204 can represent only a limited range of numbers, the output of the summer 202 wraps around when that range is exceeded. The first register 204 is controlled by the CLK and EN signals. The value stored in the first register 204 is available at the register's output. The stored value is updated with the sum of the current first register output and the value of the signal INC when both the clock CLK and enable EN signals are asserted. Thus, at an active time, that is, one at which an output is being produced, the next valid interpolated time is calculated by adding the current value of INC to the stored value to produce a desired output time interval signal INT 1.

The second summer 202 and second register 208, are combined with a feedback loop to form a second accumulator 222. The second register 208 is used for storing and outputting the value generated by the second summer 206. Since the second register 208 can represent only a limited range of numbers, the output of the summer 206 wraps around when that range is exceeded.

The second accumulator 222 is used to generate an input sample time interval signal, INT 2, which is a function of the input sample rate as indicated by the master clock signal CLK. Thus, for each input sample time, the second accumulator 222 is incremented to produce the signal INT 2.

The first and second accumulators 220, 222 are for desired output time and actual input time, respectively. These accumulators are implemented using modulo arithmetic. For example, if the value of INC is less than two, modulo two adders can be used as the summers 202, 206. This refers to the maximum floating point value that can be generated by the summers 202, 206 and thus the accumulators 220, 222. That is, each accumulator represents numbers from 0.0 to 2.0-minimum_step_size, where minimum_step_size is the step size corresponding to the least-significant bit (LSB) of the number system used.

The INT1 signal representing the desired output time is supplied to the ceiling circuit 210 and a subtracting input of the summer 214. The ceiling circuit 210 rounds its input value up to the next higher integer or outputs its input value, if it is already an integer. Thus, it processes the input signal INT1 to generate an integer output IINT1 representing the input sample time at which an output is to be generated.

The signal IINT1 is supplied to a summing input of the summer 214 and to a second input of the comparator 212. The summer 214 subtracts the value of the signal INT1 from the value IINT1 to generate a delay signal D having a value corresponding to the desired delay between the time of the last clock signal for which an output was generated and the desired time of the next output sample to be produced.

The comparator 212 receives at its input the signal INT2 representing a count of the input sample time and the signal IINT1 representing the desired next input sample time at which a sample is to be output. When the comparator 212 determines that the signals INT2 and IINT1 are equal, the output of the comparator 212 is asserted, i.e., the enable signal EN is set to "1". When the signals INT2 and IINT1 are not equal, the enable signal EN is disabled, i.e., set to "0".

In addition to generation of the enable control signal, the control circuit 102 is responsible for generating the delay control signals SEL and ALPHA. These signals are produced using the splitter 216 and look-up table 218 to process the delay signal D generated by the summer 214.

The total delay desired from an integral sample time, represented by the signal D, is the ceiling of the desired interpolated time minus the actual desired interpolated time. Hence, the delay can vary from 0<DELAY<1 [input sample periods].

Of this delay, the part that is an integral multiple of the delay 0.25 is implemented using one of four fixed filters included in the signal generation circuit 104. Hence, the fixed delay, DELAYFIX, is obtained as follows:

DELAYFIX=floor(4*DELAY)/4 [input sample periods], where the floor function rounds its argument down to the next lower integer or, if the argument is already an integer, the output is that integer.

This is accomplished by just taking the first two fractional bits (two bits of highest significance) in the binary representation (the halves bit and the quarters bit). These two bits represent 00=0 fixed delay; 01=0.25 fixed delay; 10=0.5 fixed delay; 11=0.75 fixed delay. The two bits which represent the fixed delay are obtained by using the splitter 216 to extract the 2 most significant bits from the signal D and using these two bits as the SEL signal.

The remainder of the delay, not accounted for by the use of the fixed filters, can be expressed as DELAYVAR, where DELAYVAR=DELAY−DELAYFIX [input sample periods].

The signal DELAYVAR is made up of the bits below the quarters bit, hence

0<DELAYVAR<0.25 [input sample periods].

The signal DELAYVAR is generated by using the lower bits of the signal D, after the 2 MSB's are removed for use as the SEL signal. The splitter outputs the DELVAR signal to the look-up table 218.

In order to implement DELAYVAR in the variable delay filter included in the signal generation circuit 104, the correct ALPHA corresponding to the desired delay must be calculated. In the implementation shown, a lookup table (LUT) 218 is used to convert between the value DELAYVAR and the actual signal value ALPHA used to control the signal generation circuit. The look-up table 218 includes the ALPHA values needed to produce desired delays corresponding to the full range of possible delays which may be indicated by the DELAYVAR signal. In response to the input signal DELVAR, the look-up table 218 outputs the ALPHA value needed to produce the variable delay indicated by the signal DELVAR.

In cases where it is assumed that the utilized variable delay filter's delay is a linear function of the input value ALPHA, the look-up table 218 can be eliminated, and the ALPHA signal created by a linear operation on DELAYVAR: that is,

ALPHA=C1*DELAYVAR+C2,

Where C1 and C2 are constants. However, such an implementation ignores the non-linear relationship between alpha and the low frequency group delay.

Figure 5:
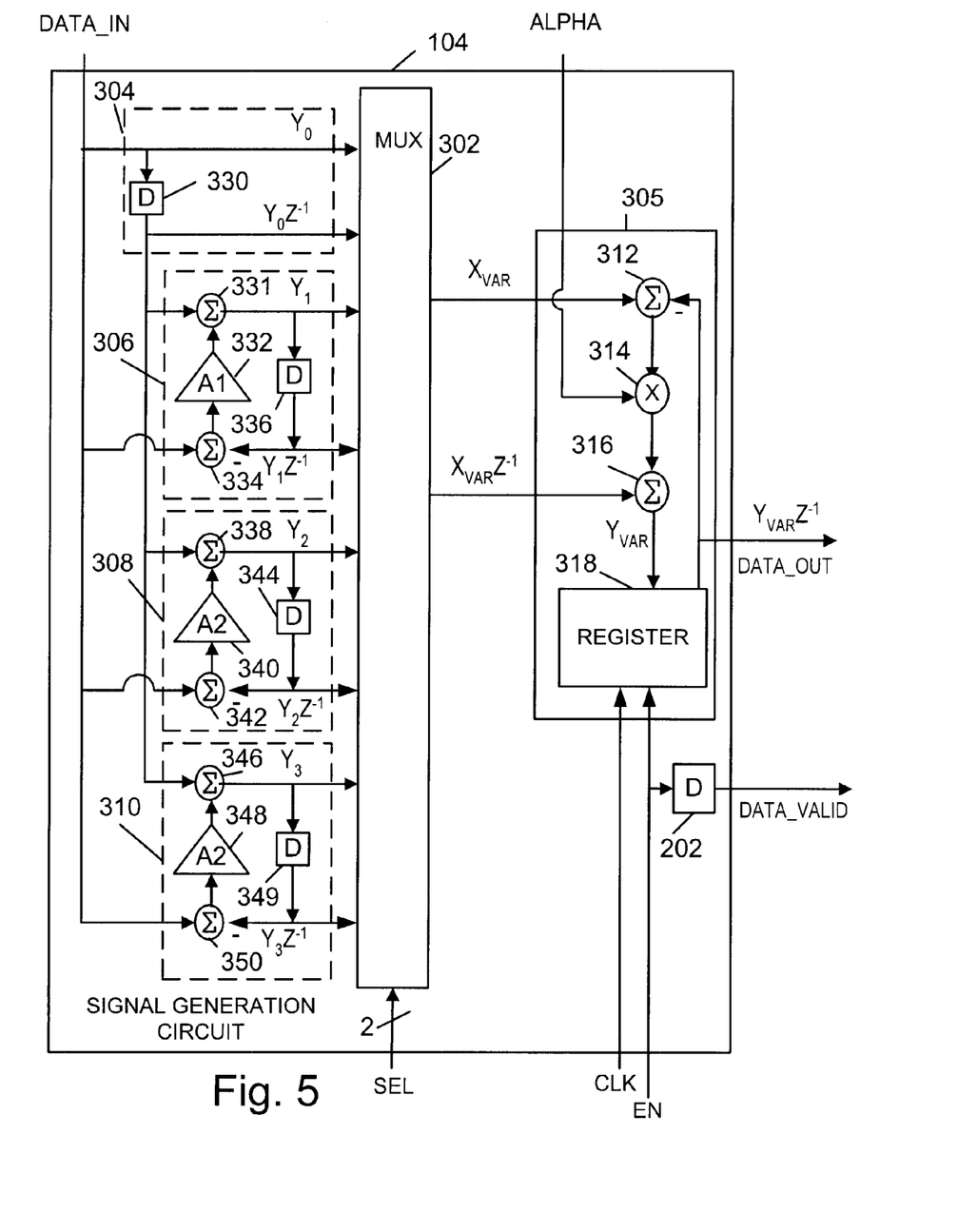
FIG. 5 illustrates a first exemplary signal generation circuit suitable for use in the digital resampling circuit illustrated in FIG. 1.

FIG. 5 shows the detailed structure of the signal generation circuit 104. The signal generation circuit 104 comprises first through fourth fixed delay filter circuits 304, 306, 308, 310, a multiplexer (MUX) 302, a variable delay filter 305, and a delay element 202 coupled together as illustrated in FIG. 5. As discussed above, the input to the signal generation circuit 104 includes a stream of digital samples the signal DATA_IN, the SEL signal, the EN signal, and the ALPHA signal. The SEL signal is used to select which of the fixed delay filters 304, 306, 308, 310 is to be used. Note that the first fixed delay filter 304 has a signal delay of 0 while the second, third and fourth fixed filters have signal delays of 0.25, 0.5 and 0.75, respectively. The ALPHA controls the delay of the variable-delay filter 305. In the FIG. 5 embodiment, the variable delay filter 305 produces a delay from 0 to one-quarter of the input sample period. The DATA_OUT signal is generated by the variable delay filter 305.

In order that the upsampled signals be available whenever required, the four fixed-delay filters 304, 306, 308, 310 are clocked on every input sample time-even though their outputs are not always used. This makes them linear, time-invariant filters. Delay elements, used in the fixed filters 304, 306, 308, and 310 labeled as D indicate registers that are clocked on every master clock time. Accordingly, such registers act as unit delay elements. A CLK input of an output register 318 included in the variable delay filter 305, i.e., the output filter, is enabled only when the ENABLE signal is asserted. Thus, the variable delay filter 305 produces a new output at the appropriate times and not on every master CLK cycle.

The structure of the first through fourth fixed delay filters 304, 306, 308, 310 will now be described.

As illustrated in FIG. 5, the first fixed filter circuit 304 comprises a single delay element 330. The circuit 304 receives as its input the DATA_IN signal, the sample of which at the current time is indicated as $Y_0$. The first fixed filter circuit 304 outputs the input signal $Y_0$ via a first filter output and outputs a delayed signal $Y_0Z^{-1}$ created by delaying the input signal using the delay element 330, via a second filter output. Both of the signal outputs, $Y_0$ and $Y_0Z^{-1}$, are provided to the MUX 302 via a first pair of MUX inputs.

The second through fourth fixed filter circuits 306, 308, 310 are implemented using filters of the same design but with different multipliers which produce different filter delays. Each of the first through fourth fixed filters includes first and second summers (331, 334), (338, 342) (346, 350), a multiplier 332, 340, 348 and a delay element 336, 344, 349. Coupled together as illustrated in FIG. 5. The first multiplier has a gain of A1, the second multiplier has a gain of A2, and the third multiplier has a gain of A3. Exemplary values of A1, A2 and A3 are 0.6, 0.3333 and 0.142875, producing delays (see FIG. 3) of 0.25, 0.5 and 0.75 sample periods, respectively.

Each of the second through fourth fixed filter circuits 306, 308, 310 have first and second filter inputs. The first filter input couples the delayed signal output of the first filter 304 to a first input of the first summer of each fixed filter. Accordingly, the delay element 330 serves as part of each of the fixed filters 306, 308, 310 as well as the first fixed filter 304. The second fixed filter input of each of the fixed filters 306, 308, 310 couples the DATA_IN signal to a first input of the filters' second summer.

Internal to each filter 306, 308, 310, the filters' multiplier 332, 340 or 348 couples the output of the second summer to a second input of the filter's first summer. The output of each fixed filter's first summer servers as the first output of the fixed filter 306, 308, 310. The first output of each fixed filter is also delayed by the filter's delay circuit 336, 344 or 349 and output as the filter's second output signal. The second output signal of each filter, which is a delayed version of the filter's first output signal, is also supplied to the second input of the filter's second summer, which is a subtracting input, thereby creating a delay feedback loop.

Through the use of the above described four fixed filter circuits, the MUX 302 is supplied with four sets of filter input signals ($Y_0, Y_0Z^{-1}$), ($Y_1, Y_1Z^{-1}$), ($Y_2, Y_2Z^{-1}$), ($y_3, Y_3Z^{-1}$), each signal pair corresponding to a different fixed signal delay. The MUX 302, in response to the select signal, SEL, outputs one of the four sets of signal pairs to the variable delay filter 305 as the signals ($X_{VAR}$, $X_{VAR}Z^{-1}$). Thus, the variable delay filter 305 receives two data signal inputs, e.g., a signal sample and a delayed signal sample, corresponding to the signals in one of the four sets of fixed filter outputs.

The variable delay filter 305 comprises, first and second summers 312, 316, a multiplier 314, and a delay element in the form of a register 318. The first summer 312 receives as its first input the signal $X_{VAR}$ while the second summer 316 receives as its first input the signal $X_{VAR}Z^{-1}$. The first summer 312 receives as its second input, which is a subtracting input, the output signal $Y_{VAR}Z^{-1}$. Thus the first summer 312 subtracts the current output value $Y_{VAR}Z^{-1}$ from the input signal $X_{VAR}$ to produce a data input to the multiplier 314.

The multiplier 314 multiplies the value input thereto by the amount ALPHA. Thus, ALPHA can be used to effect the signal delay. The value resulting from the multiplication operation is supplied to the summer 316 and summed with the second variable delay filter input signal $X_{VAR}Z^{-1}$. The resulting signal $Y_{VAR}$ is stored in the register 318 and then output, when the register is clocked, as the signal $Y_{VAR}Z^{-1}$. As discussed above, clocking of the register 318 requires that the output enable signal, EN, be asserted. Thus, a new output signal is output only when the EN signal is asserted.

The output $Y_{var}$ from the variable filter 305 could be used as the resampled output. However, the signal $Y_{var}$ is generated on each master clock cycle. Accordingly, using the signal $Y_{var}$ would result in the output including some samples which would subsequently need to be discarded in the case where the output sample rate is to be lower than the input sample rate.

The register 318 outputs a new output sample (value) when the enable signal EN is asserted. When the output sample rate is lower than the input sample rate, there will be fewer output samples than input samples. Assuming that subsequent circuitry is driven by the master clock signal CLK, it is desirable to know during which master clock time periods the output of the register 318 is to be used and at which master clock time periods it is to be ignored, e.g., because a new output sample was not produced.

In order to generate a signal which indicates during which master CLK cycles the DATA_OUT signal represents a valid output sample, a DATA_VALID signal is generated by delaying the ENABLE signal for a unit of one master CLK period using the unit delay element 202. The DATA_VALID signal is asserted when the output signal $Y_{var}z^{-1}$ is valid, and de=asserted when it is invalid.

The resampled signal DATA_OUT and the DATA_VALID signal can be coupled to circuitry such as a timing and synchronization circuit used to update the control signal INC, as necessary. In the case of a demodulator, the timing synchronization circuitry can be a timing recovery circuit.

The methods and apparatus of the present invention may be used in a wide range of applications where signal resampling, e.g., interpolation, needs to be performed to produce a signal having the same or a lower sample rate than the original signal being processed. An exemplary application is a digital demodulator integrated circuit (IC) where the resampling circuit of the present invention can be used to potentially reduce overall system complexity and implementation cost.

Figure 6:
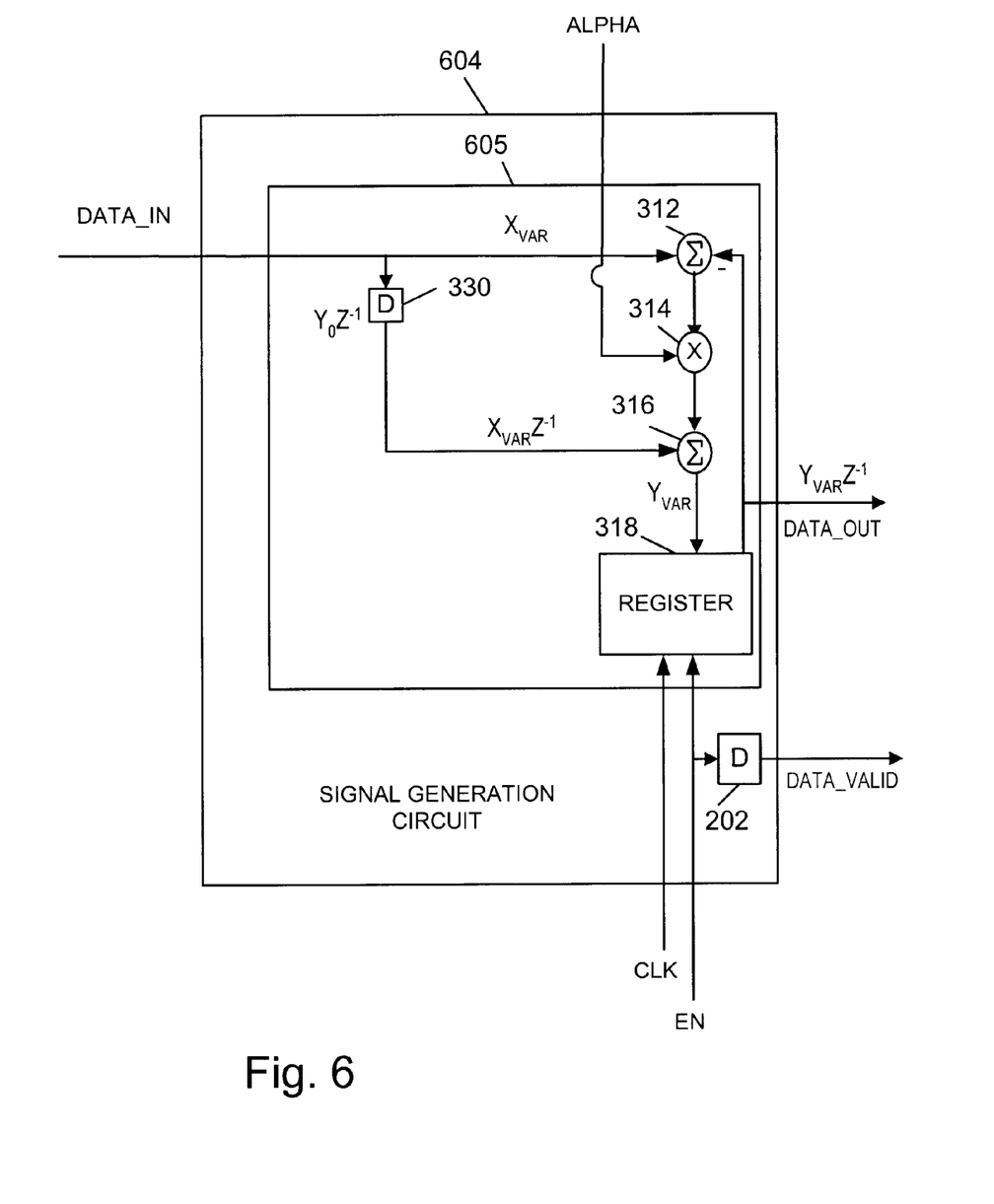
FIG. 6 illustrates a second exemplary signal generation circuit suitable for use in the digital resampling circuit illustrated in FIG. 1.

While the described exemplary signal generation circuit 104 includes a plurality of filters (304, 306, 308, 310) with fixed signal delays followed by a filter 305 with a variable delay, the signal generation circuit of the present invention can be implemented by simply using a filter 605, e.g., an all-pass IIR filter with a variable delay. As illustrated in FIG. 6, the variable delay filter 605 can be implemented by combining the fixed filter 304 and the variable filter 305. In such an embodiment, the MUX 302, and filter circuits 306, 308, 310 shown in FIG. 5 are eliminated producing the signal generation circuit 604. Also, the control circuit 102 need not produce the SEL signal, since the multiplexor 302 is not used since the full set ofbits, representing the needed delay, are used to address the look-up table 218, in this case. The use of a single variable delay filter 605 for signal resampling is particularly well suited for embodiments where the range of signal delays to be supported is small.

Other embodiments of the invention are possible. For example, the described technique for resampling can, and in one embodiment is, used for resampling to a higher rate. In such an embodiment, the control circuit 102 is modified to provide for multiple output samples for each input sample. For example, to resample a signal from a rate of 4 to a rate of 5, the resampling circuit should be capable of computing 5 output samples for each four input samples. The relationship between the input signal, W, and output signal, Z, in such a case, is as follows:

For input sample W(0), there is no output. For input sample W(1), there is an output sample of Z(0) calculated with a delay of 1.0 and there is an output sample of Z(1) calculated with a delay of 0.2. For input sample W(2), there is an output sample of Z(2) calculated with a delay of 0.4. For input sample W(3), there is an output sample of Z(3) calculated with a delay of 0.6. For input sample W(4), there is an output sample of Z(4) calculated with a delay of 0.8. For input sample W(5), there is an output sample of Z(5) calculated with a delay of 1.0 and there is an output sample of Z(6) calculated with a delay of 0.2, etc. Thus, in continuous operation where the samples of an input signal are processed on an ongoing basis, there will be five Z output samples for each set of four W input samples.

Two signal generation circuits of the present invention, controlled by a common control circuit, can be used in parallel to process in-phase and quadrature-phase signals, thereby allowing for the resampling of complex signals using the present invention.

Numerous additional embodiments, within the scope of the present invention, will be apparent to those of ordinary skill in the art in view of the description included herein and the claims which follow.

What is claimed is:

1. A digital resampling circuit, comprising:

a variable delay infinite impulse response filter circuit for generating filtered output samples from input samples, at least some of the output samples being interpolated values;

control circuitry for controlling the duration of the delay used by said variable delay filter circuit when generating said filtered output samples from said input samples; and a plurality of fixed filters, each fixed filter having a fixed delay and a filter output; and a multiplexer coupled to the plurality of fixed filters and to the variable delay filter, the multiplexer supplying the output from a selected one of the fixed filters to the input of the variable filter.

2. The digital resampling circuit of claim 1, wherein the control circuitry includes:

means for varying the delay used by said variable delay filter when generating at least three consecutive filtered output samples so that at least two different filter delays are used in generating samples from the same input signal.

3. The digital resampling circuit of claim 1, further comprising:

means for generating a valid data indicator which indicates when the output of the variable delay filter is valid.

4. The digital resampling circuit of claim 1, wherein the variable delay filter circuit is an all-pass filter.

5. The digital resampling circuit of claim 1, wherein the control circuit includes:

means for controlling the variable delay filter circuit to output samples at a lower rate than a rate at which input samples are supplied to the variable delay filter.

6. The digital resampling circuit of claim 5, further comprising:

means for generating a valid data indicator which indicates when the output of the variable delay filter represents a valid output data sample.

7. The digital resampling circuit of claim 1, wherein at least one of the plurality of fixed filters is a finite impulse response filter.

8. A digital resampling circuit, comprising:

a variable delay infinite impulse response filter circuit for generating filtered output samples from input samples, at least some of the output samples being interpolated values; and control circuitry for controlling the duration of the delay used by said variable delay filter circuit when generating said filtered output samples from said input samples;

a plurality of fixed filters, each fixed filter having a fixed delay and a filter output, at least one of the plurality of fixed filters being an infinite impulse response filter; and a multiplexer coupled to the plurality of fixed filters and to the variable delay filter, the multiplexer supplying the output from a selected one of the fixed filters to the input of the variable filter.

9. A digital resampling circuit, comprising:

a variable delay infinite impulse response filter circuit for generating filtered output samples from input samples, at least some of the output samples being interpolated values;

control circuitry for controlling the duration of the delay used by said variable delay filter circuit when generating said filtered output samples from said input samples;

means for generating a valid data indicator which indicates when the output of the variable delay filter represents a valid output data sample; and a plurality of fixed filters, each fixed filter having a fixed delay and a filter output; and means for selecting which one of the fixed filter outputs is supplied to the input of the variable filter.

* * * * *